United States Patent
Pu et al.

(10) Patent No.: US 11,527,405 B2
(45) Date of Patent: Dec. 13, 2022

(54) IN-DIE METROLOGY METHODS AND SYSTEMS FOR PROCESS CONTROL

(71) Applicant: ASML Netherlands B.V., Veldhoven (NL)

(72) Inventors: Lingling Pu, San Jose, CA (US); Wei Fang, Milpitas, CA (US); Zhong-wei Chen, San Jose, CA (US)

(73) Assignee: ASML Netherlands B.V., Veldhoven (NL)

(*) Notice: Subject to any disclaimer, the term of this patent is extended or adjusted under 35 U.S.C. 154(b) by 463 days.

(21) Appl. No.: 16/730,897

(22) Filed: Dec. 30, 2019

(65) Prior Publication Data

US 2020/0211845 A1    Jul. 2, 2020

Related U.S. Application Data (60) Provisional application No. 62/787,203, filed on Dec. 31, 2018.

(51) Int. Cl.
*H01L 21/02* (2006.01)
*G03F 7/20* (2006.01)
(Continued)

(52) U.S. Cl.
CPC .... *H01L 21/02691* (2013.01); *G03F 7/70433* (2013.01); *G03F 7/70625* (2013.01);
(Continued)

(58) Field of Classification Search
CPC ... H01L 21/02691; H01L 22/12; H01L 22/20; H01L 22/10; G03F 7/70625;
(Continued)

(56) References Cited

U.S. PATENT DOCUMENTS 7,804,994 B2  9/2010  Adel et al.
7,847,939 B2  12/2010  Smith et al.
(Continued)

FOREIGN PATENT DOCUMENTS

JP    2005518107 A    6/2005
JP    2015528125 A    9/2015
(Continued)

OTHER PUBLICATIONS

Office Action of the Intellectual Property Office of Taiwan issued in related Taiwanese Patent Application No. 108148585, dated Jan. 12, 2021 (9 pgs.).

(Continued)

*Primary Examiner* — Kiet T Nguyen
(74) *Attorney, Agent, or Firm* — Finnegan, Henderson, Farabow, Garrett & Dunner, LLP (57) ABSTRACT

Systems and methods for in-die metrology using target design patterns are provided. These systems and methods include selecting a target design pattern based on design data representing the design of an integrated circuit, providing design data indicative of the target design pattern to enable design data derived from the target design pattern to be added to second design data, wherein the second design data is based on the first design data. Systems and methods can further include causing structures derived from the second design data to be printed on a wafer, inspecting the structures on the wafer using a charged-particle beam tool, and identifying metrology data or process defects based on the inspection. In some embodiments the systems and methods further include causing the charged-particle beam tool, the second design data, a scanner, or photolithography equipment to be adjusted based on the identified metrology data or process defects.

15 Claims, 5 Drawing Sheets

(51) Int. Cl.
   *G06F 30/39*   (2020.01)
   *H01J 37/147*  (2006.01)
   *H01J 37/244*  (2006.01)

(52) U.S. Cl.
   CPC .......... *G03F 7/70633* (2013.01); *G06F 30/39* (2020.01); *H01J 37/1471* (2013.01); *H01J 37/244* (2013.01)

(58) Field of Classification Search
   CPC ............. G03F 7/70633; G03F 7/70508; G03F 7/70616; G03F 7/70683; G03F 7/70433; G06F 30/39; H01J 37/1471; H01J 37/244; H01J 2237/2817
   USPC ........................................................ 438/401
   See application file for complete search history.

(56) References Cited

U.S. PATENT DOCUMENTS

| | | | |
|---|---|---|---|
| 8,669,775 B2 | 3/2014 | Choi et al. | |
| 2003/0223630 A1 | 12/2003 | Adel et al. | |
| 2007/0230770 A1* | 10/2007 | Kulkarni | G06T 7/33 382/149 |
| 2007/0288219 A1* | 12/2007 | Zafar | G03F 1/84 703/14 |
| 2015/0356233 A1 | 12/2015 | Fouquet et al. | |
| 2016/0370698 A1 | 12/2016 | Chen et al. | |
| 2018/0068047 A1* | 3/2018 | van Kervinck | H01L 21/027 |
| 2018/0268099 A1* | 9/2018 | Katzir | G01N 21/9501 |

FOREIGN PATENT DOCUMENTS

| | | |
|---|---|---|
| JP | 2017516138 A | 6/2017 |
| JP | 2017524963 A | 8/2017 |
| TW | I549012 | 9/2016 |
| TW | I620004 | 4/2018 |

OTHER PUBLICATIONS

International Search Report issued in related PCT International Application No. PCT/EP2019/086466, dated Apr. 3, 2020 (3 pgs.).

Jianming Zhou et al., "Eliminating the offset between overlay metrology and device patterns using computational metrology target design" Proc. SPIE, vol. 9778, DOI: 10.1117/12.2219439, Mar. 8, 2016 (12 pgs.).

Osamu Inoue et al., "In-die overlay metrology by using CD-SEM", Proc. SPIE, vol. 8681, DOI: 1117/12.2011035, Apr. 10, 2013 (12 pgs.).

Kai-Hsuing Chen et al., "Improving on-product performance at litho using integrated diffraction-based metrology and computationally designed device-line targets fit for advanced technologies (incl. FinFET)", Proc. SPIE / IS&T, vol. 9050, DOI: 10.1117/12.2047098, Apr. 2, 2014 (10 pgs.).

Notice of Reasons for Rejection issued by the Japan Patent Office in related Japanese Patent Application No. 2021-533140; dated Sep. 21, 2022 (31 pgs.).

* cited by examiner

IN-DIE METROLOGY METHODS AND SYSTEMS FOR PROCESS CONTROL

CROSS-REFERENCE TO RELATED APPLICATIONS

This application claims priority of U.S. application 62/787,203 which was filed on Dec. 31, 2018, and which is incorporated herein in its entirety by reference.

FIELD

The embodiments provided herein are related to an in-die metrology methods and systems for process control, and more particularly, methods and systems for the identification and placement of in-die metrology target areas to identify defects in semiconductor fabrication and operation processes.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) may be employed. As the physical sizes of IC components continue to shrink, accuracy and yield in defect detection become more and more important. However, imaging resolution and throughput of inspection tools struggles to keep pace with the ever decreasing feature size of IC components.

SUMMARY

In some embodiments of the disclosure, systems and methods for in-die metrology using target design patterns are provided. Systems and methods for in-die metrology using target design patterns are provided. These systems and methods include selecting a target design pattern based on design data representing the design of an integrated circuit, providing design data indicative of the target design pattern to enable design data derived from the target design pattern to be added to second design data, wherein the second design data is based on the first design data. Systems and methods can further include causing structures derived from the second design data to be printed on a wafer, inspecting the structures on the wafer using a charged-particle beam tool, and identifying metrology data or process defects based on the inspection. In some embodiments the systems and methods further include causing the charged-particle beam tool, the second design data, a scanner, or photolithography equipment to be adjusted based on the identified metrology data or process defects.

In some embodiments, design data representing the design of an integrated circuit is represented as one of a Graphic Database System (GDS), Open Artwork System Interchange Standard (OASIS), and Caltech Intermediate Form (CIF) data files.

In some embodiments the identified metrology data or process defects are at least one of edge placement error, overlay shift, contact hole size variation, and edge roughness.

In yet another embodiment the systems and methods further comprise selecting the target design pattern from a design library based on attributes associated with the target design pattern, wherein the design library includes design patterns and corresponding attributes.

In yet another embodiment, the systems and methods further include analyzing process window qualification data associated one or more potential target design patterns, and selecting the target design pattern based on the results of the analysis.

In other embodiments, the systems and methods include analyzing design data associated with the target design pattern and selecting the target design pattern based on the results of the analysis. In some of those embodiments, the analysis can be a process simulation. In yet other embodiments, the systems and methods further include selecting the target design pattern based on similarities between the target design pattern and the design data representing the design of an integrated circuit.

In yet another embodiment, the design data derived from the target design pattern is added to the second design data at a designated location. In some embodiments, the designated location in the second design data is between components in the second design data.

In yet another embodiment, the first design data and the second design data represent different version of layout design data of the integrated circuit. In yet another embodiment, the systems and methods further include designated locations in the second design layout that can be between components in the second design layout.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to the subject matter as recited in the appended claims. For example, although some embodiments are described in the context of utilizing electron beams, the disclosure is not so limited. Other types of charged particle beams can be similarly applied.

The enhanced computing power of electronic devices, while reducing the physical size of the devices, can be accomplished by significantly increasing the packing density of circuit components such as transistors, capacitors, diodes, etc. on an IC chip. For example, an IC chip of a smart phone, which is the size of a thumbnail, may include over 2 billion transistors, the size of each transistor being less than $\frac{1}{1000}$th of a human hair. Thus, it is not surprising that semiconductor IC manufacturing is a complex and time-consuming process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get to a 75% yield, each individual step must have a yield greater than 99.4%, and if the individual step yield is 95%, the overall process yield drops to 7%.

While high process yield is desirable in an IC chip manufacturing facility, it is also essential to maintain a high wafer throughput, defined as the number of wafers processed per hour. High process yields and high wafer throughput can be impacted by the presence of defects, especially when there is operator intervention to review the defects. Thus, detection and identification of micro- and nano-sized defects by inspection tools (such as a SEM) is essential for maintaining high yields and low cost.

As the size of integrated circuits continue to shrink, the ability of existing inspection systems to identify defects during the manufacturing process also decreases. In particular, optical inspection tools suffer from a number of drawbacks. To assist with the inspection process, target design patterns are placed on a wafer to measure certain defects. But because of the size needed for optical inspection tools, these patterns are often larger than 10 $\mu m^2$, which is too large to be placed within the boundaries of IC chip dies. Due to this size, the target design patterns are typically placed at or near the scribe lines (e.g., scribe lines 333 and 337 of FIG. 3B), which is the space between the IC chips on the wafer. But placing the target design patterns on the scribe lines limit the effectiveness of the target design patterns. When target design patterns are in the scribe lines, defects in the target design patterns do not always accurately predict defects in the chip dies because they are too far away from the components of the chips. Moreover, the optical inspection tools limit the amount of complexity that can be used for the target design patterns.

Unfortunately, current optical inspection tools using target design patterns and methods for choosing those target design patterns do not meet the demands of ever improving manufacturing processes. To achieve high throughput and high yield manufacturing processes, new methods of reducing the size and effectiveness of target design patterns are necessary.

Figure 4:
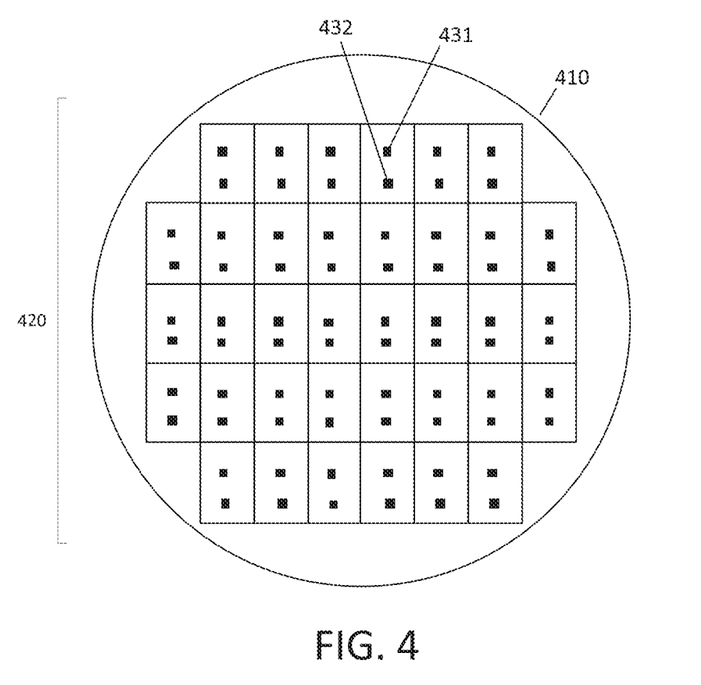
FIG. 4 is a block diagram illustrating an exemplary wafer, consistent with embodiments of the present disclosure.

In IC chip manufacturing, defect identification can include the use of specifically designed electronic structures placed on the wafer. During manufacturing, the target structures can be measured and compared to their original design to help measure discrepancies between the design of the electronic components on the wafer and the actual produced results. Previous systems required the use of large test structures. These test structures were placed in the scribe lines because they were too large to be placed inside the individual dies without interfering with their eventual operation. But by using charged-particle beam inspection (e.g., electron beam inspection) and improved methods for choosing the test structures the in-die metrology systems of the present disclosure can reduce the size of the target structures used for detecting defects. Because of the reduced size, the manufacturing system can place the structures close to or among the elements of the actual electronic device as shown in FIG. 4. Additionally, the increased precision of the embodiments disclosed herein can allow for the use of target design patterns that better match the elements of the actual dies being manufactured. By including test patterns that both match the die element components and by placing those patterns inside the dies themselves, the embodiments described herein provide much better accuracy in measuring defects during manufacturing. Target design patterns that are inside the die ensure that the distance between the design pattern and important components does not contribute to differences in measured defects. Moreover, choosing target design patterns that match the die elements increases the chances that defects in target design patterns will accurately predict defects in a matching die component.

Moreover, the increased precision and accuracy of the embodiments described herein allow for the use after development inspection ("ADI"). In ADI, the target design patterns can be developed on the silicon wafer and inspected before the rest of the manufacturing process. As a result, corrections can be made prior to etching the actual dies. This adjustment, prior to etching of dies, allows for the silicon wafer to be used to produce dies even if defects are measured, which can increase throughput and raise processing yields. In addition to ADI, the embodiments described herein can also be used with after-etch inspection ("AEI"). In AEI, the silicon wafer is inspected after etching the design on the wafer.

The increased precision and accuracy of the embodiments described herein can also allow the target design patterns to be significantly more complex than other systems. For example, complex two-dimensional patterns can be used. These patterns can include, for example, among other things, contact holes and overlaid structures. Accordingly, the embodiments described herein can allow for inspection of more advanced structures over typical systems that may be limited to simple one-dimensional patterns such as simple lines and bars.

Additionally, after target design patterns are used in manufacturing, the target design patterns and the measured results from their use can be stored in a design library to allow the target design patterns to be used for future manufacturing. The design library can be a database that stores design patterns. The design patterns can be stored in standard layout formats (e.g., Graphic Data Systems (GDS), Caltech Intermediate Forma (CIF), Open Artwork System Interchange Standard (OASIS), etc.). Along with the design pattern layouts, attributes measured from previous uses of the design patterns can be stored in the design library. Future microchip designers can look through the library to identify target design patterns that meet their needs with known and predictable results.

IC manufacturing systems consistent with those disclosed herein can also utilize Process Window Qualification ("PWQ"). PWQ involves analyzing structures made using a particular process to determine the process window for various structures that make up potential design patterns. The target design patterns can then be selected based on which target design patterns meet the requirements of a particular manufacturing process based on process window requirements. By choosing a target design pattern with a smaller window than the manufacturing requirements, the systems and methods disclosed herein can ensure that defects in the target design patterns can likely correspond to defects in the dies.

Moreover, target design pattern shape and layout can be determined using analysis of the design files. This analysis can include process simulation and risk analysis. This process can also include any analysis possible with automated design tools and can include any analysis of the design layouts to predict the behavior of the layout. Microchip designers can design target design patterns and then use automated design tools to run simulations of manufacturing the patterns. The results of many simulation runs can be used to predict the probable defect rates and process windows. By using these simulation tools, target design patterns can be designed and implemented based on the simulation results instead of requiring data from completed manufacturing runs, which can be rare and expensive.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Additional objects and advantages of the disclosed embodiments will be set forth in part in the following description, and in part will be apparent from the description, or may be learned by practice of the embodiments. Objects and advantages of the disclosed embodiments may be realized and attained by the elements and combinations set forth in the disclosure. However, exemplary embodiments of the present disclosure are not necessarily required to achieve such exemplary objects and advantages, and some embodiments may not achieve any of the stated objects and advantages.

Figure 1:
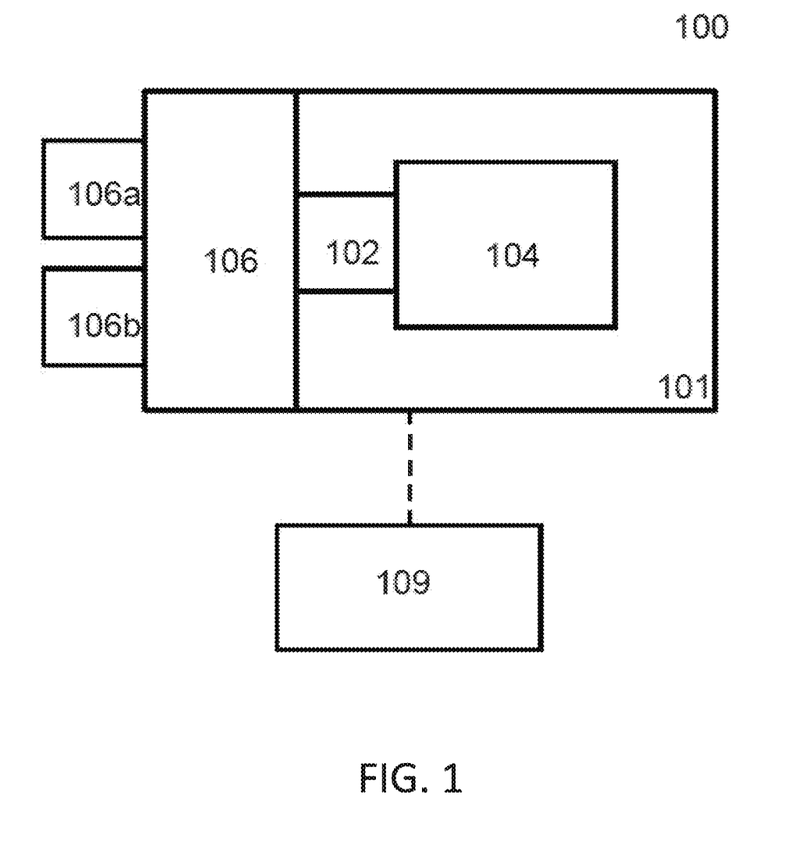
FIG. 1 is a schematic diagram illustrating an exemplary electron beam inspection (EBI) system, consistent with embodiments of the present disclosure.

Reference is now made to FIG. 1, which illustrates an exemplary electron beam inspection (EBI) system 100 consistent with embodiments of the present disclosure. EBI system 100 may be used for imaging. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be collectively referred to as "wafers" herein). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system. A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 can part of the structure.

Figure 2:
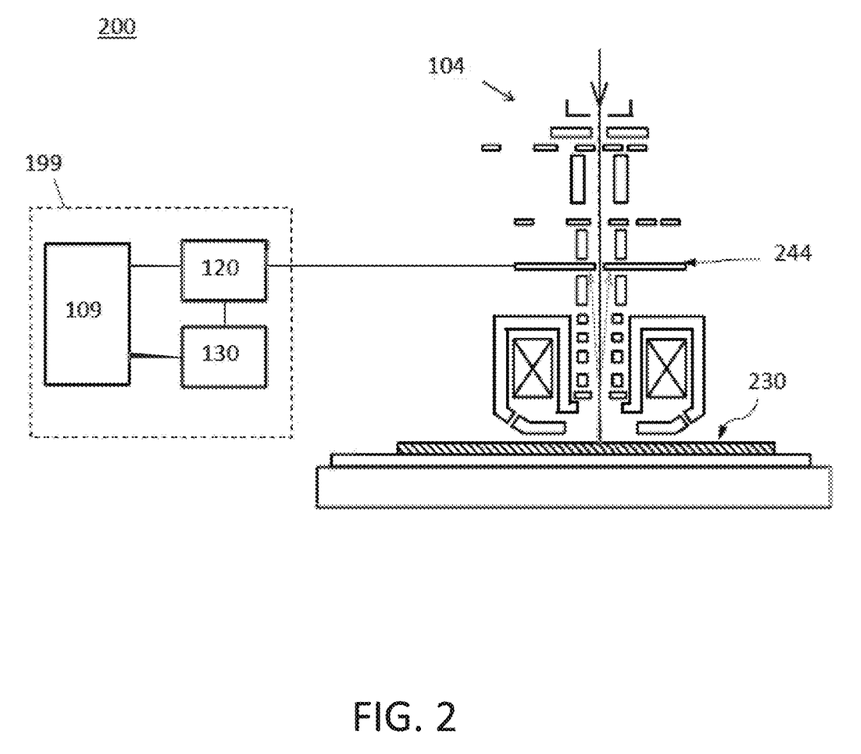
FIG. 2 is a schematic diagram illustrating an exemplary electron beam tool, consistent with embodiments of the present disclosure that can be a part of the exemplary electron beam inspection system of FIG. 1.

FIG. 2 illustrates an imaging system 200 according to embodiments of the present disclosure. Electron beam tool 104 of FIG. 2 may be configured for use in EBI system 100. Although FIG. 2 shows electron beam tool 104 as a single-beam inspection tool that may use only one primary electron beam to scan one location of a wafer 230 at a time, embodiments of the present disclosure are not so limited. For example, electron beam tool 104 may also be a multi-beam inspection tool that employs multiple primary electron beamlets to simultaneously scan multiple locations on wafer 230.

System 200 may be used for inspecting wafer 230 on a sample stage, and comprises an electron beam tool 104, as discussed above. System 200 also comprises an image processing system 199 that includes an image acquirer 120, storage 130, and controller 109. Image acquirer 120 may comprise one or more processors or circuitry, such as circuitry of the one or more processors or other circuitry. For example, image acquirer 120 may comprise a computer, server, mainframe host, terminals, personal computer, any kind of mobile computing devices, and the like, or a combination thereof. Image acquirer 120 may connect with a detector 244 of electron beam tool 104 through a medium such as an electrical conductor, optical fiber cable, portable storage media, infrared (IR), Bluetooth, internet, wireless network, wireless radio, or a combination thereof. Image acquirer 120 may receive a signal from detector 244 and may construct an image. Image acquirer 120 may thus acquire images of wafer 230. Image acquirer 120 may also perform various post-processing functions, such as generating contours, superimposing indicators on an acquired image, and the like. Image acquirer 120 may be configured to perform adjustments of brightness and contrast, etc. of acquired images. Storage 130 may be a storage medium such as a hard disk, cloud storage, random access memory (RAM), other types of computer readable memory, and the like. Storage 130 may be coupled with image acquirer 120 and may be used for saving scanned raw image data as original images, and post-processed images. Image acquirer 120 and storage 130 may be connected to controller 109. In some embodiments, image acquirer 120, storage 130, and controller 109 may be integrated together as one control unit.

In some embodiments, image acquirer 120 may acquire one or more images of a sample based on an imaging signal received from detector 244. An imaging signal may correspond to a scanning operation for conducting charged particle imaging. An acquired image may be a single scanned raw image comprising a plurality of imaging areas. The image may be stored in storage 130. The image may be an original image that may be divided into a plurality of regions. Each of the regions may comprise one imaging area containing a feature of wafer 230.

Figure 3A:
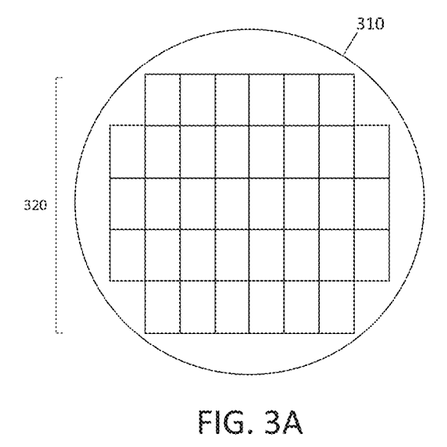
FIGS. 3A-3B are block diagrams illustrating an exemplary wafer, consistent with embodiments of the present disclosure.
Figure 3B:
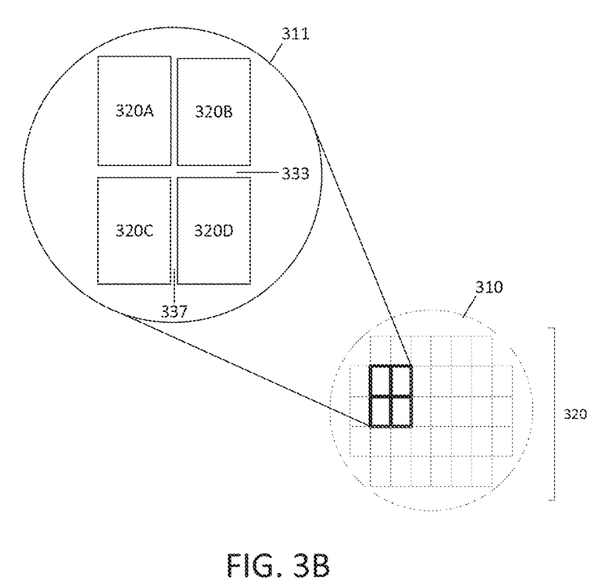

Reference is now made to FIGS. 3A and 3B, which are diagrams of an exemplary wafer 310, consistent with embodiments of the present disclosure. As discussed above in relation to FIG. 1, wafer 310 can be, for example, a semiconductor wafer. As shown in FIG. 3A, wafer 310 can contain multiple dies 320. Dies 320 can represent areas of the wafer that are either reserved for particular dies can represent dies that have already been etched on to wafer 310. As would be understood by one of ordinary skill in the art, a semiconductor device can encompass the entirety of the area represented by each of dies 320 or some smaller amount of area of each of dies 320.

FIG. 3B includes a magnification 311 showing a magnified view of a subset of dies 320, dies 320A, 320B, 320C, and 320D. Although only dies 320A, 320B, 320C, and 320D are shown in magnification 311, it is understood that there are additional dies 320 surrounding these. Magnification 311 shows spacing between dies 320A, 320B, 320C, and 320D. These spaces or delineations between the dies are called scribe lines and typically define where the wafer will be cut to separate the dies 320. As shown in magnification 311, scribe line 333 runs horizontally across wafer 310 defining the boundary between semiconductor device 320A and 320C and semiconductor device 320B and 320D. Scribe line 337 runs vertically across wafer 310 defining the boundary between semiconductor device 320A and 320B and dies 320C and 320D. Because scribe lines 333 and 337 define where the wafer will later be cut, the components of dies 320 do not generally overlap with scribe lines 333 and 337 and some space is usually placed between the scribe lines and components of dies 320. As will be discussed in more detail below, previous methods of using target design patterns place target design patterns in these scribe lines so they will not interfere with the components of dies 320.

Reference is now made to FIG. 4, which is an exemplary diagram of wafer 410. Wafer 410 can be the same wafer as wafer 310 of FIG. 3 or it can be a different wafer. Wafer 410 further includes dies 420. Like dies 320 of FIG. 3, dies 420 can represent etched devices or an area upon which dies can be etched in the future.

Dies 420 can further include target design patterns 431 and 432. Although FIG. 4, only identifies target design patterns 431 and 432 in one of dies 420, it is appreciated that target design patterns 431 and 432 can be placed in each of dies 420, as represented by the unidentified black boxes within each of dies 420 in FIG. 4. Moreover, target design patterns 431 and 432 can be the same target design pattern or can be different target design patterns. Additionally, different dies 420 can contain different target design patterns. The use of different target design patterns on different dies 420 can be advantageous for numerous reasons.

For example, in some embodiments, different dies 420 may contain different semiconductor layouts. In these embodiments, target design patterns chosen based on the specific layout of each of semiconductor device 420 can result in different target design patterns for each of semiconductor 420. The ability to use different target design patterns based on the specific layout of each of semiconductor 420 can enable a more accurate identification of defects.

In some embodiments, different target design patterns can be used based on the location of the specific semiconductor device 420 on wafer 410. For example, dies 420 that are closer to the perimeter of wafer 410 can exhibit different types of manufacturing defects than dies 420 near the center of wafer 410. Accordingly, target design patterns 431 and 432 can be chosen to identify defects that might occur based on the physical location of each of semiconductor device 420 on wafer 410.

As further shown in FIG. 4, target design patterns 431 and 432 are placed toward the center of dies 420. Because embodiments consistent with the present disclosure utilize electron beam inspection techniques, target design patterns 431 and 432 can be an order of magnitude smaller than those of previous systems. Because of the decreased size, target design patterns 431 and 432 can be placed between the components of dies 420. By placing the target design patterns closer to the actual components, defects identified in the target design patterns can more accurately model potential defects in the components of dies 420. As previously discussed, this increased accuracy can improve overall yield.

It is further appreciated that in some embodiments, target design patterns 431 and 432 are etched onto wafer 410 before the components of semiconductor 420 are etched onto wafer 420. In these embodiments, sometimes referred to as after development inspection ("ADI"), the target design patterns can be inspected and, based on the inspection or measured metrology data, adjustments can be made to the design and layout of the ICs to account for the measured defects. In some embodiments, the design and layout, a scanner, the charged-particle beam tool, or other lithography equipment can be adjusted based on the results of the inspection. The electron-beam tool can make the adjustments or provide the data to a manufacturer, controller, or processor attached to a manufacturing system, or other system to cause the adjustments to be made. Because of the small size that can be used with target design patterns 431 and 432, more space on the wafer can be used for the components of dies 420 without overlapping with target design patterns 431 or 432 and increasing wafer yield.

Figure 5:
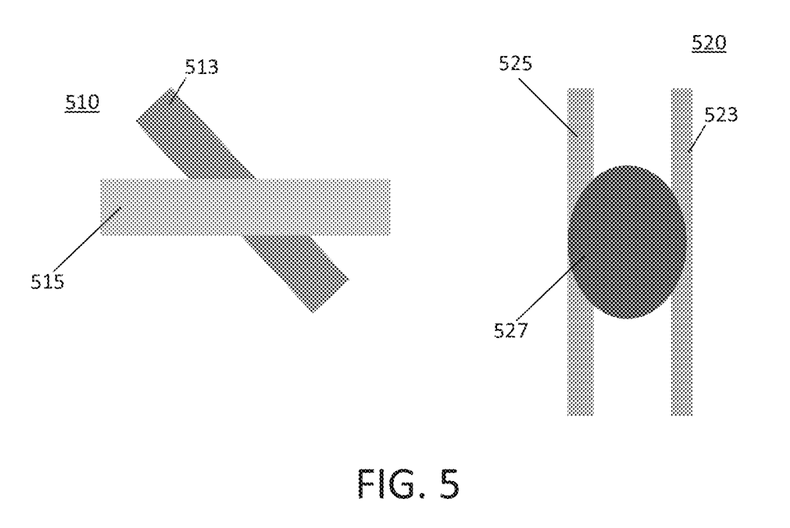
FIG. 5 is a block diagram illustrating exemplary target structures, consistent with embodiments of the present disclosure.

Target design patterns can include various shapes and sizes of electronic components. FIG. 5 shows two exemplary target design patterns, target design pattern 510 and target design pattern 520. Target design patterns 510 and 520 demonstrate distinct shapes and arrangement of components. It is appreciated that target design patterns 510 and 520 are only exemplary, and many different target design patterns are possible. It is also appreciated that target design patterns can vary in complexity, number, and arrangement of components. This variety can allow for target design patterns to more accurately match the specific dies, (e.g., dies 420 of FIG. 4) being manufactured.

As shown in FIG. 5, target design pattern 510 can include two rectangular components, target design pattern components 513 and 515. Target design pattern components 513 and 515 can be offset at an angle from one another and can overlap. Target design pattern components 513 and 515 can occupy the same or different layers on the wafer. When used, inspection of a wafer containing target design pattern 510 could reveal variations in the angle or position at which target design pattern components 513 and 515 intersect or the length and width of target design pattern components 513 and 515.

Target design pattern 520 can include three components, rectangular target design pattern components 523 and 525, and circular target design pattern component 527. In this example, target design pattern components 523 and 525 overlap with target design pattern component 527 but not with each other. Moreover, target design pattern components 523, 525, and 527 can occupy the same or different layers on the wafer. When used, inspection of a wafer containing target design pattern 520 could reveal variations in the relative position, amount of overlap, or other characteristics of target design pattern components 523, 525 and 527.

As previously discussed, it is appreciated that target design patterns 510 and 520 are only exemplary and that many different target design patterns consistent with embodiments of the present disclosure exist or can be created. Further, it is appreciated that additional target design patterns can be more or less complex, vary in shape and size, and contain more or fewer components than what is shown by target design patterns 510 and 520.

After target design pattern 510 or 520 is etched onto a wafer (e.g., wafer 410 of FIG. 4), an imaging system (e.g., imaging system 200 of FIG. 2) can inspect target design pattern 510 to determine the amount of discrepancy between the intended target design pattern 510 or 520 and target design pattern 510 or 520 actually deposited onto the wafer. The imaging system can also gather metrology data for the target design pattern. Based on the defects or metrology data, the imaging system can make adjustments to account for the measured differences. The measured differences and metrology data can be provided to the designer or design system and used to update the design or layout for the die. In some embodiments, the design and layout, a scanner, the charged-particle beam tool or other lithography equipment can be adjusted based on the results of the inspection. The electron-beam tool system can make the adjustments or provide the data to a manufacturer, controller or processor attached to a manufacturing system, or other system to cause the adjustments to be made. As previously discussed, because embodiments consistent with the present disclosure can deposit the target design pattern 510 or 520 prior to depositing one or more layers of the actual dies (e.g., dies 410 of FIG. 4), the defects can be identified and corrected without discarding the wafer.

The EBI system (e.g., EBI system 100) or a designer can select the target design patterns to include as part of the overall wafer design. Target design patterns can be stored in a target design pattern library. This library can include the target design pattern and all relevant characteristics of the target design pattern. Target design patterns can be chosen based on their similarity to the components of the semiconductor device. Moreover, by including previously measured values associated with the target design pattern in the library, target design patterns can be chosen to meet particular process requirements.

In some embodiments, target design patterns can be chosen based on Process Window Qualification ("PWQ") analysis of the target design patterns. In a PWQ analysis, a wafer can be used, in which a focus and dosage matrix is associated with the wafer. Such a matrix can show the behavior of a target design pattern under different combinations of focus and exposure or dosage during fabrications. Additionally, the measure of the line width of the target design pattern elements, or critical dimension statistics can be calculated as well as the overall defect counts. These results can be analyzed, and a process window can be inferred from the metrology results. Target design patterns with a loose process window are less prone to errors. Accordingly, the required process window for a manufacturing run can dictate which target design patterns should be selected. Target design patterns with a tighter process window than required by the manufacturing process can be chosen to ensure any defects in the target design patterns will correlate to defects in the dies so that proper adjustments can be made to increase yield.

In some embodiments, target design patterns can be chosen based on simulation and risk analysis. In these embodiments, target design patterns are designed and tested using automated design software. This process can generate, for example, a predictive model for edge placement error (EPE) distribution based on the simulations. This would indicate the amount of error that occurs in overlapping elements of a design relative to each other. A target design pattern having a higher EPE probability can be selected over one having lower EPE probability to ensure that any EPE in the layout will likely also occur in the target design pattern and can be corrected during inspection.

Based on one or more of the above considerations the embodiments consistent with the present disclosure can select the appropriate target design patterns to meet the requirements of a specific manufacturing process.

Figure 6:
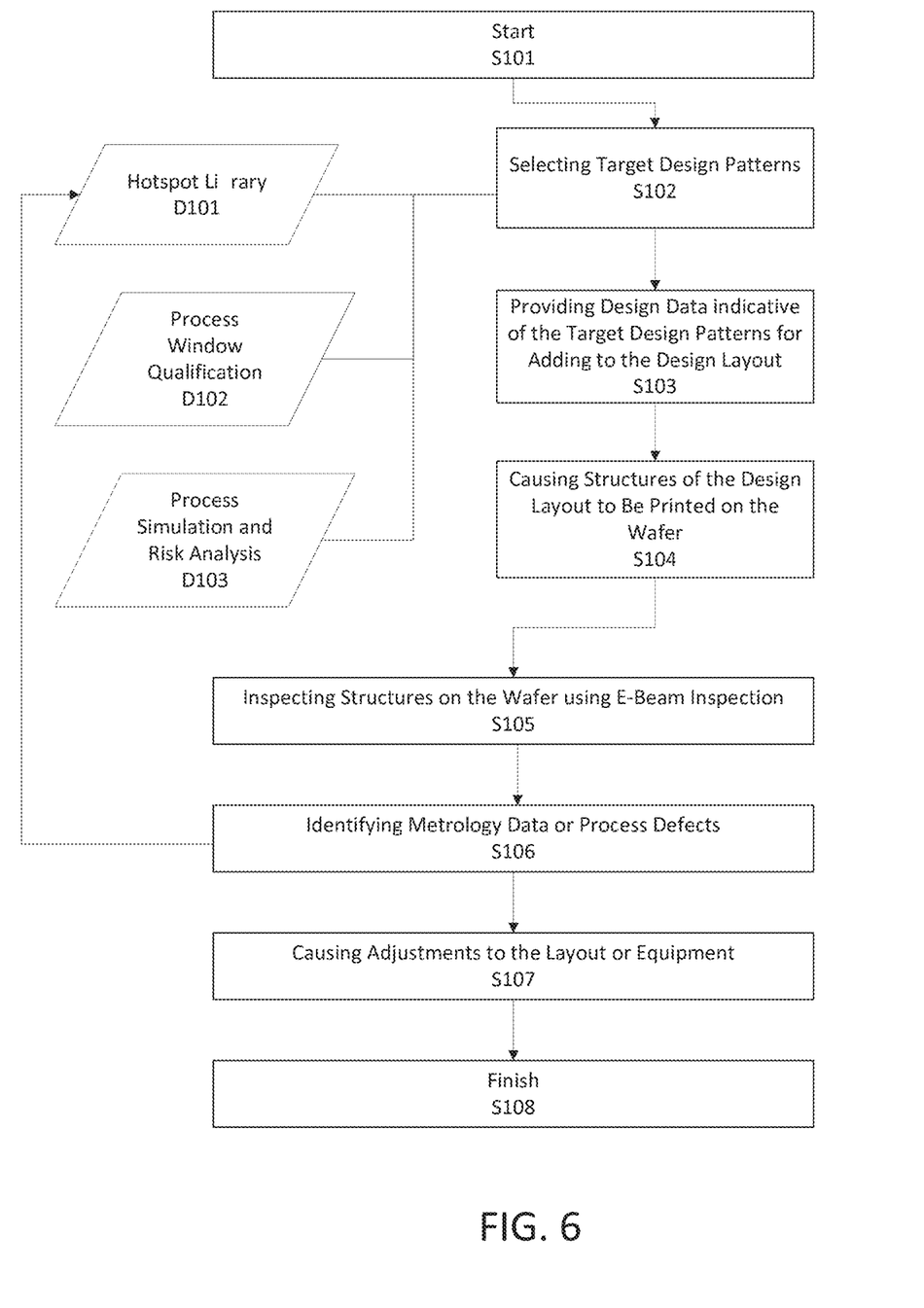
FIG. 6 is a flowchart representing an exemplary method, consistent with embodiments of the present disclosure.

Reference is now made to FIG. 6, which illustrates a flowchart of an exemplary in-die metrology system, consistent with embodiments of the present disclosure. A controller may be programmed to implement one or more blocks of the flowchart of FIG. 6. The controller may be coupled with a charged particle beam apparatus. The controller may control operations of the charged particle beam apparatus. The controller may be configured to receive information gathered from a detector of the charged particle beam apparatus and may be configured to perform processing functions. For example, controller 109 of FIG. 1 may be configured to execute a whole or a part of the method of FIG. 6.

In a step S101, the method can begin. At step S102, the controller or a designer can select target design patterns to include on the wafer. The target design patterns can be selected based on data from one or more of hotspot library D101, a PWQ analysis D102, or a process simulation and risk analysis D103, among others. A process simulation can include any analysis possible with automated design tools and can include any analysis of the design layouts to predict the behavior of the layout. The results from these various data sources can be compared to the current manufacturing requirements and design to select the target design patterns that can help ensure one or more of these requirements are met and that both closely resemble the overall design.

After selecting the target design pattern, in step S103, design data indicative of the target design patterns can be provided for adding to the layout of the wafer. In some embodiments, the step of providing design data indicative of the target design pattern further includes the step of providing the target design pattern or data representing the target design pattern to a manufacturer. In these embodiments, for example, the manufacturer can receive the data representing the target design pattern and add the data to the design data for the integrated circuit. It is further appreciated that providing the target design pattern or data representing the target design pattern includes providing the data to a processor of an SEM or of a manufacturer to enable the addition of the data to the design data for the integrated circuit. The addition of the data to the design data can be performed automatically by the processor or can be directed by a person using a design application, such as a computer aided design ("CAD") application. This updated design can then be used to manufacture or produce the integrated circuit. These target design patterns can then be etched onto the wafer, either by the system, process, or equipment selecting the target design pattern or by the manufacturer who received the design data.

Because of the electron beam inspection methods used by embodiments consistent with present disclosure, the target design patterns can be very small. For example, in some embodiments, target design patterns can be as small as 1 µm$^2$. Moreover, due to their small size the provided design data can include causing the target design patterns to be placed at locations within the semiconductor design instead of limiting locations to within or near, for example, scribe lines.

In step S104, the system can cause structures of the design layout to be printed on the wafer. In some embodiments, causing structures of the design layout to be printed results from instructions to, for example, a manufacturer to print the design layout with the added target design patterns. Design data is data that represents the design layout of an integrated circuit. In some embodiments, the target design patterns are placed onto the wafer prior to depositing the remainder of the design.

In step S105, the printed target design patterns are inspected using charged-particle inspection tools (e.g., such as EBI system 200 of FIG. 2). In step S106, the inspection results are analyzed by the charged-particle beam system (e.g., EBI system 200). The analysis can reveal defects from the manufacturing process such as, for example, EPE, overlay shifts, contact hole size, and edge roughness as well as additional metrology data. The results of the analysis for particular target design patterns can be included in hotspot library D101 for use by later processes In step S107, the charged-particle beam system or a computer system can use the results of the analysis to cause adjustments to the layout or design or of the dies, or to cause adjustments to the settings of a scanner or other photolithography equipment used to pattern the dies. In some embodiments, these adjustments can be made by the charged-particle beam system. In other embodiments, the charged-particle beam system can provide data about the adjustments to other systems or equipment (e.g., other photolithography equipment, a scanner, or a controller or processer attached to such equipment) to cause the adjustments to be made. Because embodiments consistent with the present disclosure allow for ADI, the layout adjustments provided in step S107 can occur prior to the semiconductor design being etched onto the wafer, and the scanner settings adjustments in step S107 can occur prior to the semiconductor design being patterned onto the wafer. Additionally, a layer with defects can be deprocessed (e.g., removed from the wafer), and the layer can be reprocessed and re-imaged by the scanner, but with the adjusted scanner settings or design. By detecting and adjusting the layout or the scanner settings for these defects at this stage, the system can increase yield because the wafer can still be used for manufacturing in the adjusted system.

The process can end in step S108.

In some embodiments, a detector may communicate with a controller that controls a charged particle beam system. The controller may instruct components of the charged particle beam system to perform various functions, such as controlling a charged particle source to generate a charged particle beam and controlling a deflector to scan the charged particle beam over a sample. The controller may also perform post-processing functions, brightness/contrast adjustment, image subdivision, image processing, generating contours, superimposing indicators on an acquired image, and the like. The controller may combine functions of, for example, image acquirer 120 and controller 109 of FIG. 1. Additionally, the controller may comprise a storage such as storage 130 of FIG. 1. A non-transitory computer readable medium may be provided that stores instructions for a processor of controller 109 to carry out selecting target design patterns, charged particle beam inspection, analyzing target design pattern results, adjusting particle beam scanners based on the analysis, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The embodiments may further be described using the following clauses:

1. A method related to in-die metrology using a charged-particle beam tool, the method comprising:
    selecting a target design pattern based on first design data representing a design of an integrated circuit; and
    providing design data indicative of the target design pattern to enable design data derived from the target design pattern to be added to second design data, wherein the second design data is based on the first design data.
2. The method of clause 1 wherein the first design data is represented as one of Graphic Database System (GDS), Open Artwork System Interchange Standard (OASIS), or Caltech Intermediate Form (CIF) data.
3. The method of any one of clauses 1 and 2, further comprising:
    causing structures derived from the second design data to be printed on a wafer;
    inspecting the structures on the wafer using a charged-particle beam tool; and
    identifying metrology data or process defects based on the inspection.
4. The method of clause 3, further comprising causing the second design data to be adjusted based on the identified metrology data or process defects.
5. The method of clause 3, further comprising causing a scanner to be adjusted based on the identified metrology data or process defects.
6. The method of clause 3, further comprising causing photolithography equipment to be adjusted based on the identified metrology data or process defects.
7. The method of any one of clauses 3-6, wherein the identified metrology data or process defects are at least one of edge placement error, overlay shift, contact hole size variation, and edge roughness.
8. The method of any one of clauses 1-7, wherein selecting the target design pattern further comprises:
    selecting the target design pattern from a design library based on attributes associated with the target design pattern, wherein the design library includes design patterns and corresponding attributes.
9. The method of any one of clauses 1-8, wherein selecting the target design pattern further comprises:
    analyzing process window qualification data associated one or more potential target design patterns; and
    selecting the target design pattern based on the results of the analysis.
10. The method of any one of clauses 1-9, wherein selecting the target design pattern further comprises:
    analyzing design data associated with the target design pattern; and
    selecting the target design pattern based on results of the analysis.
11. The method of clause 10, wherein the analysis is a process simulation.
12. The method of any one of clauses 1-11, wherein selecting the target design pattern further comprises:
    selecting the target design pattern based on similarities between the target design pattern and the first design data.
13. The method of any one of clauses 1-12, wherein the design data derived from the target design pattern is added to the second design data at a designated location.
14. The method of clause 13, wherein the designated location in the second design data is between components in the second design data.

15. The method of any one of clauses 1-14, wherein the first design data and the second design data represent different versions of layout design data of the integrated circuit.

16. A system for in-die metrology, comprising:
   a charged particle beam apparatus including a detector;
   an image acquirer that includes circuitry to receive a detection signal from the detector and construct an image including a target design pattern; and
   a controller with at least one processor and a non-transitory computer readable medium comprising instructions that, when executed by the processor, cause the system to:
      select a target design pattern based on first design data representing a design of an integrated circuit; and
      provide design data indicative of the target design pattern to enable design data derived from the target design pattern to be added to second design data, wherein the second design data is based on the first design data.

17. The system of clause 16, wherein the first design data is represented as one of Graphic Database System (GDS), Open Artwork System Interchange Standard (OASIS), and Caltech Intermediate Form (CIF) data.

18. The system of any one of clauses 16 and 17, wherein the instructions, when executed by the processor, further cause the system to:
   cause structures derived from the second design layout to be printed on a wafer;
   inspect the structures on the wafer using a charged-particle beam tool; and
   identify metrology data or process defects based on the inspection.

19. The system of clause 18, wherein the instructions, when executed by the processor, further cause the system to cause the second design data to be adjusted based on the identified metrology data or process defects.

20. The system of clause 18, wherein the instructions, when executed by the processor, further cause the system to cause a scanner to be adjusted based on the identified metrology data or process defects.

21. The system of clause 18, wherein the instructions, when executed by the processor, further cause the system to cause photolithography equipment to be adjusted based on the identified metrology data or process defects.

22. The system of any one of clauses 18-21, wherein the identified process defects are at least one of edge placement error, overlay shift, contact hole size variation, and edge roughness.

23. The system of any one of clauses 16-22, further comprising:
   a memory;
   a design library stored in the memory wherein the design library includes design patterns and corresponding attributes.

24. The system of any one of clauses 16-24, wherein the instructions, when executed by the processor, further cause the system to:
   analyze process window qualification data associated one or more potential target design patterns; and
   select the target design pattern based on the results of the analysis.

The system of any one of clauses 16-25, wherein the instructions, when executed by the processor, further cause the system to:
   analyze design data associated with the target design pattern; and
   select the target design pattern based on results of the analysis.

25. The system of clause 25, wherein the analysis is a process simulation.

26. The system of any one of clauses 16-26, wherein the instructions, when executed by the processor, further cause the system to select the target design pattern based on similarities between the target design pattern and the first design data.

27. The system of any one of clauses 16-27, wherein the design data derived from the target design pattern is added to the second design data at a designated location.

28. The system of clause 28, wherein the designated location in the second design data is between components in the second design data.

29. The system of any one of clauses 16-29, wherein the first design data and the second design data represent different versions of layout design data of the integrated circuit.

30. A non-transitory computer readable medium storing a set of instructions that is executable by one or more processors of a system to cause the system to perform a method comprising:
   selecting a target design pattern based on first design data representing a design of an integrated circuit; and
   providing design data indicative of the target design pattern to enable design data derived from the target design pattern to be added to second design data, wherein the second design data is based on the first design data.

31. The computer readable medium of clause 31, wherein the first design data is represented as one of Graphic Database System (GDS), Open Artwork System Interchange Standard (OASIS), or Caltech Intermediate Form (CIF) data.

32. The computer readable medium of any one of clauses 31 and 32, wherein the set of instructions that is executable by one or more processors of a system to cause the system to further perform:
   causing structures derived from the second design data to be printed on a wafer;
   inspecting the structures on the wafer using a charged-particle beam tool; and
   identifying metrology data or process defects based on the inspection.

33. The computer readable medium of clause 33, wherein the set of instructions that is executable by one or more processors of a system to cause the system to further perform, causing the second design data based to be adjusted on the identified metrology data or process defects.

34. The computer readable medium of clause 33, wherein the set of instructions that is executable by one or more processors of a system to cause the system to further perform, causing a scanner to be adjusted based on the identified metrology data or process defects.

35. The computer readable medium of clause 33, wherein the set of instructions that is executable by one or more processors of a system to cause the system to further perform, causing photolithography equipment to be adjusted based on the identified metrology data or process defects.

36. The computer readable medium of any one of clauses 33-36, wherein the identified metrology data or process defects are at least one of edge placement error, overlay shift, contact hole size variation, and edge roughness.

37. The computer readable medium of any one of clauses 31-37, wherein the set of instructions that is executable by one or more processors of a system to cause the system to further perform: select the target design pattern from a design library based on attributes associated with the target design pattern, wherein the design library includes design patterns and corresponding attributes.

38. The computer readable medium of any one of clauses 31-38, wherein the set of instructions that is executable by one or more processors of a system to cause the system to further perform:

analyze process window qualification data associated one or more potential target design patterns; and select the target design pattern based on the results of the analysis.

39. The computer readable medium of any one of clauses 31-39, wherein the set of instructions that is executable by one or more processors of a system to cause the system to further perform:

analyzing design data associated with the target design pattern; and selecting the target design pattern based on results of the analysis.

40. The computer readable medium of clause 40, wherein the analysis is a process simulation.

41. The computer readable medium of any one of clauses 31-41, wherein the set of instructions that is executable by one or more processors of a system to cause the system to further perform:

selecting the target design pattern based on similarities between the target design pattern and the first design data.

42. The computer readable medium of any one of clauses 31-42, wherein the design data derived from the target design pattern is added to the second design data at a designated area.

43. The computer readable medium of clause 43, wherein the designated location in the second design data is between components in the second design data.

44. The computer readable medium of any one of clauses 31-44, wherein the first design data and the second design data represent different versions of layout design data of the integrated circuit.

The block diagrams in the figures illustrate the architecture, functionality, and operation of possible implementations of systems, methods, and computer hardware/software products according to various exemplary embodiments of the present disclosure. In this regard, each block in a schematic diagram may represent certain arithmetical or logical operation processing that may be implemented using hardware such as an electronic circuit. Blocks may also represent a module, a segment, or a portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted.

It should also be understood that each block of the block diagrams, and combination of the blocks, may be implemented by special purpose hardware-based systems that perform the specified functions or acts, or by combinations of special purpose hardware and computer instructions.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A non-transitory computer readable medium storing a set of instructions that is executable by one or more processors of a system to cause the system to perform a method comprising:

selecting a target design pattern based on first design data representing a design of an integrated circuit; and providing design data indicative of the target design pattern to enable design data derived from the target design pattern to be added to second design data, wherein the second design data is based on the first design data.

2. The computer readable medium of claim 1, wherein the first design data is represented as one of Graphic Database System (GDS), Open Artwork System Interchange Standard (OASIS), or Caltech Intermediate Form (CIF) data.

3. The computer readable medium of claim 1, wherein the set of instructions that is executable by one or more processors of the system to cause the system to further perform:

after structures derived from the second design data are printed on a wafer, inspecting the structures on the wafer using a charged-particle beam tool; and identifying metrology data or process defects based on the inspection.

4. The computer readable medium of claim 3, wherein the set of instructions that is executable by one or more processors of a system to cause the system to further perform, causing the second design data to be adjusted based on the identified metrology data or process defects.

5. The computer readable medium of claim 3, wherein the identified metrology data or process defects are at least one of edge placement error, overlay shift, contact hole size variation, and edge roughness.

6. The computer readable medium of claim 1, wherein the set of instructions that is executable by one or more processors of a system to cause the system to further perform:

selecting the target design pattern from a design library based on attributes associated with the target design pattern, wherein the design library includes design patterns and corresponding attributes.

7. The computer readable medium of claim 1, wherein the set of instructions that is executable by one or more processors of a system to cause the system to further perform:

analyzing process window qualification data associated one or more potential target design patterns; and selecting the target design pattern based on the results of the analyzing.

8. The computer readable medium of claim 7, wherein the analyzing comprises a process simulation.

9. The computer readable medium of claim 1, wherein the set of instructions that is executable by one or more processors of a system to cause the system to further perform:

analyzing design data associated with the target design pattern; and selecting the target design pattern based on results of the analyzing.

10. The computer readable medium of claim 1, wherein the set of instructions that is executable by one or more processors of a system to cause the system to further perform:

selecting the target design pattern based on similarities between the target design pattern and the first design data.

11. The computer readable medium of claim 1, wherein the design data derived from the target design pattern is added to the second design data at a designated location.

12. The computer readable medium of claim 11, wherein the designated location in the second design data is between components in the second design data.

13. The computer readable medium of claim 1, wherein the first design data and the second design data represent different versions of layout design data of the integrated circuit.

14. A system for in-die metrology, comprising:
a charged particle beam apparatus including a detector;
an image acquirer that includes circuitry to receive a detection signal from the detector and construct an image including a target design pattern; and
a controller with at least one processor and a non-transitory computer readable medium comprising instructions that, when executed by the processor, cause the system to:
 select a target design pattern based on first design data representing a design of an integrated circuit; and
 provide design data indicative of the target design pattern to enable design data derived from the target design pattern to be added to second design data, wherein the second design data is based on the first design data.

15. The system of claim 14, wherein the instructions, when executed by the processor, further cause the system to:
after structures derived from the second design data are printed on a wafer, inspect the structures on the wafer using a charged-particle beam tool; and
identify metrology data or process defects based on the inspection.

* * * * *